(12) United States Patent
Je et al.

(10) Patent No.: US 8,771,418 B2
(45) Date of Patent: Jul. 8, 2014

(54) SUBSTRATE-PROCESSING APPARATUS AND SUBSTRATE-PROCESSING METHOD FOR SELECTIVELY INSERTING DIFFUSION PLATES

(75) Inventors: Sung Tae Je, Gyeonggi-do (KR); Chan Yong Park, Gyeonggi-do (KR); Kyoung Hun Kim, Gyeonggi-do (KR)

(73) Assignee: Eugene Technology Co., Ltd., Gyeonggi-do (KR)

( * ) Notice: Subject to any disclaimer, the term of this patent is extended or adjusted under 35 U.S.C. 154(b) by 160 days.

(21) Appl. No.: 13/382,812

(22) PCT Filed: Jul. 2, 2010

(86) PCT No.: PCT/KR2010/004338
§ 371 (c)(1),
(2), (4) Date: Jan. 6, 2012

(87) PCT Pub. No.: WO2011/004987
PCT Pub. Date: Jan. 13, 2011

(65) Prior Publication Data
US 2012/0135145 A1  May 31, 2012

(30) Foreign Application Priority Data
Jul. 8, 2009 (KR) .................. 10-2009-0062066

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl.
CPC ............................... *C23C 16/45565* (2013.01)
USPC .................. 118/715; 156/345.33; 156/345.34

(58) Field of Classification Search
USPC .......................... 118/715; 156/345.33–345.34
See application file for complete search history.

(56) References Cited

U.S. PATENT DOCUMENTS 5,884,009 A * 3/1999 Okase .......................... 392/418
5,968,275 A * 10/1999 Lee et al. .................. 118/723 R (Continued)

FOREIGN PATENT DOCUMENTS

JP            3289806 B2    6/2002
KR   10-2006-0014495 A    2/2006

(Continued)

OTHER PUBLICATIONS

English Language Abstract of JP 08-088184 A which is an application publication of JP 3289806 B2.

(Continued)

*Primary Examiner* — Rudy Zervigon
(74) *Attorney, Agent, or Firm* — Rabin & Berdo, P.C.

(57) ABSTRACT

According to one embodiment of the present invention, a substrate-processing apparatus comprises: a lower chamber with an open top; an upper chamber which covers the top of the lower chamber, and which cooperates with the lower chamber to form an internal space for substrate-processing; a shower head arranged in a lower portion of the upper chamber to supply reaction gas to the internal space, and forming a buffer space between the shower head and the upper chamber; a gas supply port formed in the upper chamber to supply reaction gas to the buffer space; and a diffusion unit arranged in the buffer space to diffuse the reaction gas supplied through the gas supply port. The diffusion unit includes: a plurality of diffusion areas which are blocked from each other, in order to enable the reaction gas to be diffused therein; a plurality of diffusion holes for placing the gas supply port and the diffusion areas in communication; and one or more diffusion plates, the shapes of which correspond to the shapes of the diffusion areas, and which are selectively inserted into the respective diffusion areas.

11 Claims, 6 Drawing Sheets

(56) References Cited

U.S. PATENT DOCUMENTS

| | | | |
|---|---|---|---|
| 6,123,775 A * | 9/2000 | Hao et al. | 118/724 |
| 6,245,192 B1 * | 6/2001 | Dhindsa et al. | 156/345.34 |
| 6,415,736 B1 * | 7/2002 | Hao et al. | 118/723 E |
| 6,444,040 B1 | 9/2002 | Herchen et al. | |
| 6,537,419 B1 * | 3/2003 | Kinnard | 156/345.34 |
| 6,576,062 B2 * | 6/2003 | Matsuse | 118/719 |
| 6,635,117 B1 * | 10/2003 | Kinnard et al. | 118/723 R |
| 6,782,843 B2 * | 8/2004 | Kinnard et al. | 118/723 E |
| 6,872,258 B2 * | 3/2005 | Park et al. | 118/715 |
| 6,872,259 B2 * | 3/2005 | Strang | 118/715 |
| 7,037,846 B2 * | 5/2006 | Srivastava et al. | 438/710 |
| 7,449,416 B2 * | 11/2008 | Becknell et al. | 438/725 |
| 7,481,886 B2 * | 1/2009 | Kato et al. | 118/715 |
| 7,581,511 B2 * | 9/2009 | Mardian et al. | 118/723 MW |
| 7,658,800 B2 * | 2/2010 | Chen et al. | 118/715 |
| 7,931,749 B2 * | 4/2011 | Amikura et al. | 118/715 |
| 7,955,986 B2 * | 6/2011 | Hoffman et al. | 438/714 |
| 8,038,835 B2 * | 10/2011 | Hayashi et al. | 156/345.34 |
| 8,080,107 B2 * | 12/2011 | Kennedy et al. | 118/715 |
| 8,252,114 B2 * | 8/2012 | Vukovic | 118/715 |
| 8,262,922 B2 * | 9/2012 | Dhindsa et al. | 216/67 |
| 8,268,181 B2 * | 9/2012 | Srivastava et al. | 216/60 |
| 8,430,962 B2 * | 4/2013 | Masuda | 118/715 |
| 8,484,846 B2 * | 7/2013 | Dhindsa | 29/890.1 |
| 8,500,952 B2 * | 8/2013 | Dhindsa et al. | 156/345.37 |
| 8,580,076 B2 * | 11/2013 | Becknell et al. | 156/345.25 |
| 8,617,351 B2 * | 12/2013 | Hoffman et al. | 156/345.46 |
| 8,628,616 B2 * | 1/2014 | Takasuka et al. | 118/715 |
| 8,668,775 B2 * | 3/2014 | Moshtagh et al. | 118/715 |
| 8,679,255 B2 * | 3/2014 | Masuda | 118/715 |
| 8,702,866 B2 * | 4/2014 | Augustino et al. | 118/715 |
| 2001/0010207 A1 * | 8/2001 | Yamamoto et al. | 118/723 MW |
| 2002/0017243 A1 * | 2/2002 | Pyo | 118/715 |
| 2003/0010452 A1 * | 1/2003 | Park et al. | 156/345.33 |
| 2003/0019580 A1 * | 1/2003 | Strang | 156/345.33 |
| 2003/0089314 A1 | 5/2003 | Matsuki et al. | |
| 2003/0205328 A1 * | 11/2003 | Kinnard et al. | 156/345.37 |
| 2004/0134611 A1 * | 7/2004 | Kato et al. | 156/345.33 |
| 2004/0140053 A1 * | 7/2004 | Srivastava et al. | 156/345.39 |
| 2004/0235299 A1 * | 11/2004 | Srivastava et al. | 438/689 |
| 2004/0238123 A1 * | 12/2004 | Becknell et al. | 156/345.33 |
| 2004/0261712 A1 * | 12/2004 | Hayashi et al. | 118/723 E |
| 2005/0011447 A1 * | 1/2005 | Fink | 118/715 |
| 2005/0241767 A1 | 11/2005 | Ferris et al. | |
| 2006/0124169 A1 * | 6/2006 | Mizusawa et al. | 137/7 |
| 2007/0175391 A1 * | 8/2007 | Mizusawa | 118/689 |
| 2007/0181181 A1 * | 8/2007 | Mizusawa | 137/1 |
| 2007/0215048 A1 * | 9/2007 | Suzuki et al. | 118/725 |
| 2007/0218200 A1 * | 9/2007 | Suzuki et al. | 427/248.1 |
| 2007/0234955 A1 * | 10/2007 | Suzuki et al. | 118/715 |
| 2008/0078746 A1 | 4/2008 | Masuda | |
| 2008/0087641 A1 * | 4/2008 | De La Llera et al. | 216/67 |
| 2008/0178805 A1 * | 7/2008 | Paterson et al. | 118/723.1 |
| 2008/0302303 A1 * | 12/2008 | Choi et al. | 118/723 R |
| 2009/0000551 A1 * | 1/2009 | Choi et al. | 118/723 R |
| 2009/0159001 A1 | 6/2009 | Um | |
| 2009/0246374 A1 * | 10/2009 | Vukovic | 427/255.28 |
| 2010/0055807 A1 * | 3/2010 | Srivastava et al. | 438/9 |
| 2010/0136216 A1 * | 6/2010 | Tsuei et al. | 427/9 |
| 2010/0243166 A1 * | 9/2010 | Hayashi | 156/345.34 |
| 2012/0097330 A1 * | 4/2012 | Iyengar et al. | 156/345.34 |
| 2012/0103264 A1 * | 5/2012 | Choi et al. | 118/728 |
| 2012/0135145 A1 * | 5/2012 | Je et al. | 427/248.1 |

FOREIGN PATENT DOCUMENTS

| | | |
|---|---|---|
| KR | 10-2007-0004137 A | 1/2007 |
| KR | 10-2008-0015754 A | 2/2008 |

OTHER PUBLICATIONS

English Language Abstract of KR 10-2006-0014495 A.
English Language Abstract of KR 10-2007-0004137 A.
English Language Abstract of KR 10-2008-0015754 A.
International Search Report of PCT/KR2010/004338 mailed on Feb. 10, 2011.

* cited by examiner

FIG. 7

| Inner 1'st Zone[8P] | | | Inner 2'nd Zone[16P] | Outer Zone[24P] | |
|---|---|---|---|---|---|
| Reference | Min | 206.10 | | 207.50 | 196.50 |
| | Max | 213.00 | | 217.50 | 218.50 |
| | AVG | 210.14 | | 212.59 | 207.19 |
| | RNG | 6.90 | | 10.00 | 22.00 |
| | UNIF | 1.64 | | 2.35 | 5.31 |
| 1차 Tune | Min | 197.90 | | 201.70 | 201.60 |
| | Max | 212.40 | | 216.20 | 211.90 |
| | AVG | 205.40 | | 211.23 | 207.08 |
| | RNG | 14.50 | | 14.50 | 10.30 |
| | UNIF | 3.53 | | 3.43 | 2.49 |
| 2차 Tune | Min | 206.90 | | 207.10 | 203.00 |
| | Max | 212.70 | | 218.70 | 212.00 |
| | AVG | 209.16 | | 212.38 | 207.72 |
| | RNG | 5.80 | | 11.60 | 9.00 |
| | UNIF | 1.39 | | 2.73 | 2.17 |

SUBSTRATE-PROCESSING APPARATUS AND SUBSTRATE-PROCESSING METHOD FOR SELECTIVELY INSERTING DIFFUSION PLATES

TECHNICAL FIELD

The present invention disclosed herein relates to a substrate-processing apparatus and substrate-processing method for selectively inserting diffusion plates, and more particularly, a substrate-processing apparatus and substrate-processing method for selectively inserting diffusion plates into a plurality of diffusion areas.

BACKGROUND ART

A semiconductor device includes a plurality of layers on a silicon substrate. Such a layer is deposited on the substrate through a deposition process. The deposition process has several important issues that are important to evaluate the deposited layers and select a deposition method.

First, an example of the issues is 'quality' of the deposited layer. The 'quality' represents composition, contamination levels, defect density, and mechanical and electrical properties. The composition of each of the layers may be changed according to conditions of the deposition process. This is very important for obtaining a specific composition.

Second, another example of the issues is a uniform thickness over the wafer. Specifically, a thickness of a film deposited on a pattern having a nonplanar shape with a stepped portion is very important. Here, whether the thickness of the deposited film is uniform may be determined through a step coverage which is defined as a ratio of a minimum thickness of the film deposited on the stepped portion divided by a thickness of the film deposited on the pattern.

Another issue respect to the deposition is a filling space. This represents a gap filling in which an insulating layer including an oxide layer is filled between metal lines. A gap is provided to physically and electrically isolate the metal lines from each other. Among the issues, uniformity is one of very important issues with respect to the deposition process. A non-uniform layer may cause high electrical resistance on the metal lines to increase possibility of mechanical damage.

DISCLOSURE

Technical Problem

The present invention provides a substrate-processing apparatus and substrate-processing method that can secure process uniformity.

Other objects of the present invention will become apparent with reference to the drawings.

Technical Solution

In one embodiment, a substrate-processing apparatus includes: a lower chamber having an opened upper side; an upper chamber opening or closing the upper side of the lower chamber, the upper chamber cooperating with the lower chamber to define an inner space in which a process for processing a substrate is performed; a shower head disposed in a lower portion of the upper chamber to supply a reaction gas toward the inner space, the shower head together with the upper chamber defining a buffer space therebetween; a gas supply port disposed in the upper chamber to supply the reaction gas into the buffer space; and a diffusion unit disposed in the buffer space to diffuse the reaction gas supplied through the gas supply port, wherein the diffusion unit includes: a plurality of diffusion areas in which the reaction gas is diffused, the plurality of diffusion areas being blocked from each other; a plurality of diffusion holes communicating with the gas supply port and the diffusion areas, respectively; and one or more diffusion plates each having a shape corresponding to each of the diffusion areas, the one or more diffusion plates being selectively inserted into the diffusion areas.

Each of the diffusion areas may include: a block plate disposed parallel to and spaced from one surface of the shower head, the block plate having the diffusion holes; and sidewalls protruding from one surface of the block plate facing injection holes defined in the shower head to partition a space spaced between the block plate and the one surface of the shower head into the diffusion areas.

The diffusion areas may include: a central area; a plurality of first areas disposed about the central area; and a plurality of second areas disposed about the plurality of first areas, respectively.

The substrate-processing apparatus may further include a support plate disposed under the shower head to place the substrate thereon, wherein the one or more diffusion plates are respectively inserted into the diffusion areas according to process rates of the corresponding substrate areas.

The plurality of diffusion plates may be stacked on the diffusion areas.

In another embodiment, a substrate-processing apparatus includes: a chamber defining an inner space in which a process for processing a substrate is performed; and a diffusion unit disposed in an upper portion of the chamber to diffuse a reaction gas supplied from the outside, wherein the diffusion unit includes; a plurality of diffusion areas in which the reaction gas is diffused, the plurality of diffusion areas being blocked from each other; and one or more diffusion plates selectively inserted into the diffusion areas.

The diffusion areas may be disposed substantially parallel to the substrate.

In further another embodiment, a substrate-processing method using a diffusion unit including a plurality of diffusion areas disposed in an upper portion of a chamber to diffuse a reaction gas supplied from the outside and blocked from each other includes: selectively inserting diffusion plates into the diffusion areas to control a process rate with respect to a substrate.

The substrate-processing method may further include searching the process rate with respect to the substrate; and inserting the diffusion plate into a first diffusion area corresponding to an area having a high process rate of the diffusion areas.

The substrate-processing method may further include searching the process rate with respect to the substrate; and inserting the diffusion plate into a second diffusion area corresponding to an area having a low process rate of the diffusion areas.

Advantageous Effects

According to the present invention, the process uniformity may be secured.

DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIGS. 6 and 7 are graph and chart illustrating experimental results obtained using the diffusion plate of FIG. 1, respectively.

BEST MODE

Figure 1:
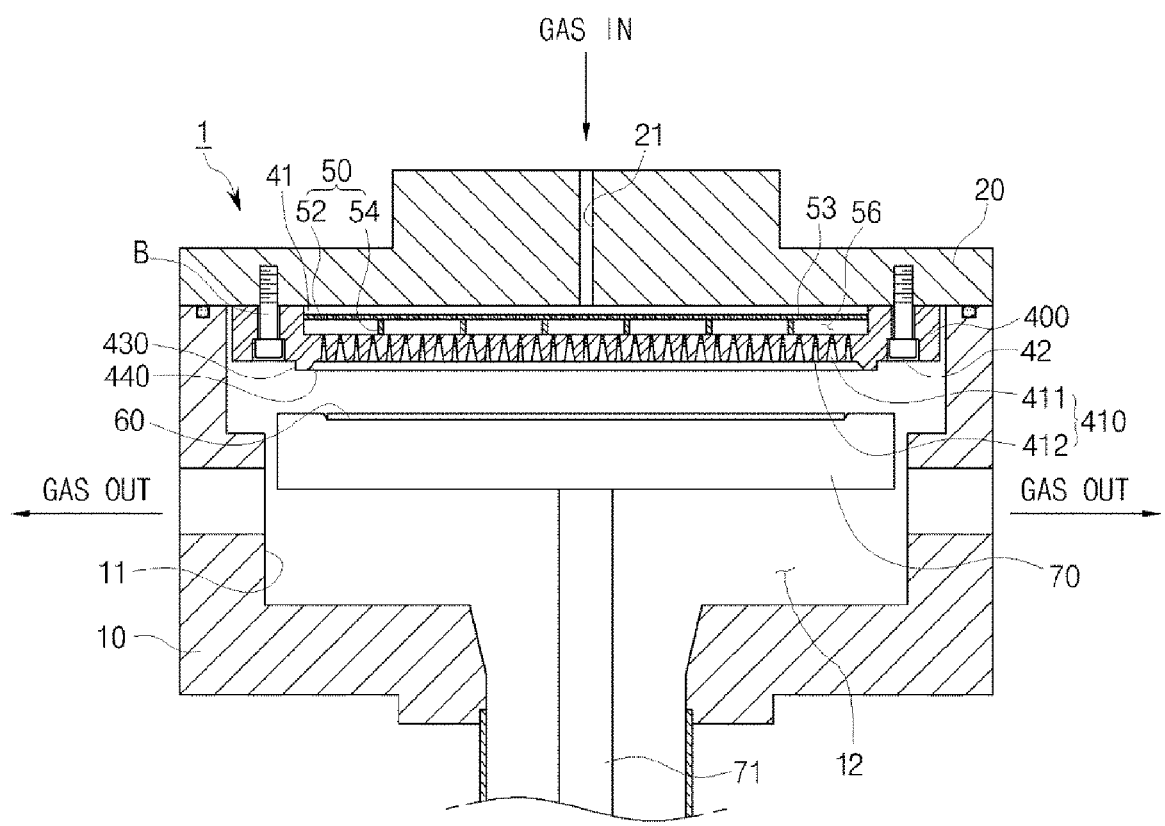
FIG. 1 is a schematic view of a substrate-processing apparatus according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of elements are exaggerated for clarity of illustration, like reference numerals refer to like elements.

Hereinafter, although a deposition apparatus is described as an example, the present invention is not limited thereto. For example, the substrate-processing apparatus may be applied to various processes for processing a substrate using a reaction gas.

Figure 2:
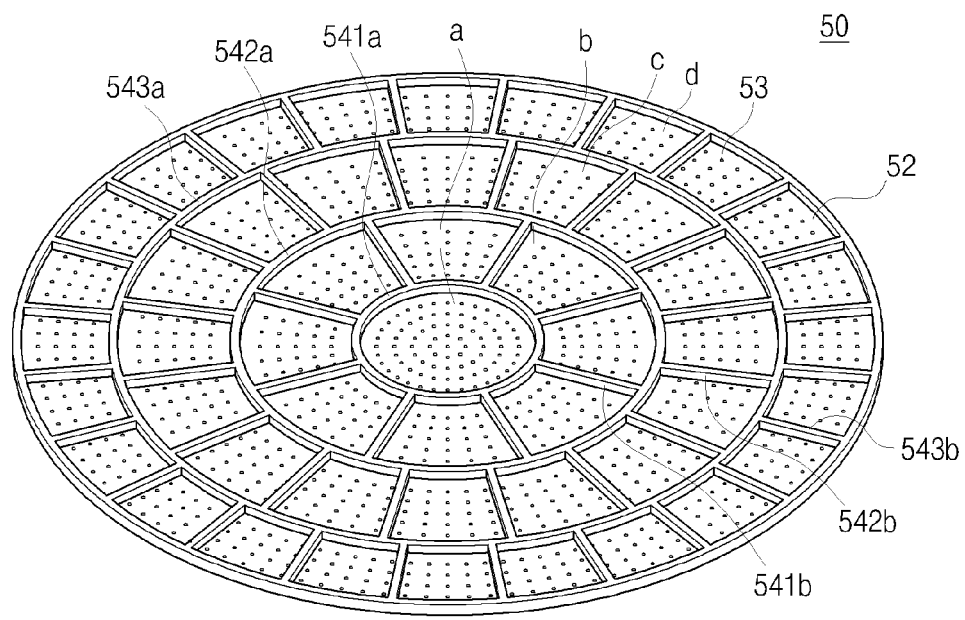
FIG. 2 is a schematic view illustrating a diffusion unit of FIG. 1.

FIG. 1 is a schematic view of a substrate-processing apparatus according to an embodiment of the present invention; FIG. 2 is a schematic view illustrating a diffusion unit of FIG. 1; Referring to FIG. 1, a substrate-processing apparatus includes a lower chamber 10 and an upper chamber 20. The lower chamber 10 has an opened upper side, and the upper chamber closes and opens the opened upper side of the lower chamber 10. When the upper chamber 20 closes the opened upper side of the lower chamber 10, the lower chamber 10 and the upper chamber 20 define an inner space 12 closed from the outside therebetween. The lower chamber 10 has an inner space. A support plate 70 on which a wafer 60 is placed on a top surface thereof is disposed in the inner space of the lower chamber 10. A support 71 is connected to a lower portion of the support plate 70 to support the support plate 70. A gas supply port 21 is disposed inside the upper chamber 20. A reaction gas supplied from the outside is introduced into the gas supply port 21 through the inner space 12. The reaction gas is provided to deposit a thin film on a surface of the wafer 60.

A shower head 400 is connected to a lower portion of the upper chamber 20. The shower head 400 may be coupled to the upper chamber 20 through coupling holes 42 defined in both ends thereof. A buffer space 41 is defined in a space spaced between the shower head 400 and the upper chamber 20. The reaction gas supplied through the gas supply port 21 is diffused within the buffer space 41. The shower head 400 has a plurality of injection holes 410 communicating with the buffer space 41 and the inner space 12. The injection holes may be divided into a main hole 411 and an auxiliary hole 412. As shown in FIG. 1, the main hole 411 has an injection angle greater than that of the auxiliary hole 412. Thus, a dead zone with respect to the injection angle of the reaction gas may be removed.

A protrusion 43 is disposed on a bottom surface of the shower head 400. Also, an induction groove 440 is defined inside the protrusion 43. The induction groove 440 may guide the reaction gas injected through the injection holes 410 to uniformly inject the reaction gas.

A diffusion unit 50 is inserted into the buffer space 41. The diffusion unit 50 includes a block plate 52 and a sidewall 54. Although the diffusion unit 50 is disposed within the shower head in the current embodiment, the present invention is not limited thereto. For example, the diffusion unit 50 may be separately provided from the shower heat or may be provided in the same shape.

The block plate 52 is disposed at a middle height of the buffer space 41 and spaced from an inner surface of the shower head 400. Also, the block plate 52 has a plurality of diffusion holes 53.

The buffer space 41 defined under the block plate 52 and the buffer space 41 defined above the block plate 52 communicate with each other through the diffusion holes 53.

The sidewall has an upper end contacting a bottom surface of the block plate 52 and an upper end contacting an inner surface of the shower head 400. The sidewall 54 supports the block plate 52 and partitions the buffer space 41 defined under the block plate 52 into a plurality of diffusion areas 56. As shown in FIG. 1, the diffusion areas 56 are disposed substantially parallel to a substrate.

As described above, the block plate 52 has the plurality of diffusion holes 53. The reaction gas supplied into the buffer layer 41 through the gas supply port 21 is supplied onto the wafer 60 through the diffusion holes 53 and the injection holes 410 defined in the shower head 400.

Referring to FIG. 2, the sidewall 54 includes first to third circular sidewalls 541a, 542a, and 543a and first to third radial sidewalls 541b, 542b, and 543b. The first to third circular sidewalls 531a, 542a, and 543a form concentric circulars with respect to a center of the block plate 52. The block plate 52 is partitioned into a circular central area a and first to third areas b, c, and d having ring shapes by the first to third circular sidewalls 531a, 542b, and 543a. The diffusion areas 56 include the central area a and the first to third areas b, c, and d. Also, the first to third radial sidewalls 541b, 542b, and 543b are connected to the outsides of the first to third circular sidewalls 541a, 542a, and 543a, respectively. Also, the first to third radial sidewalls 541b, 532b, and 543b are radially disposed with respect to a center of the block plate 52.

Figure 3:
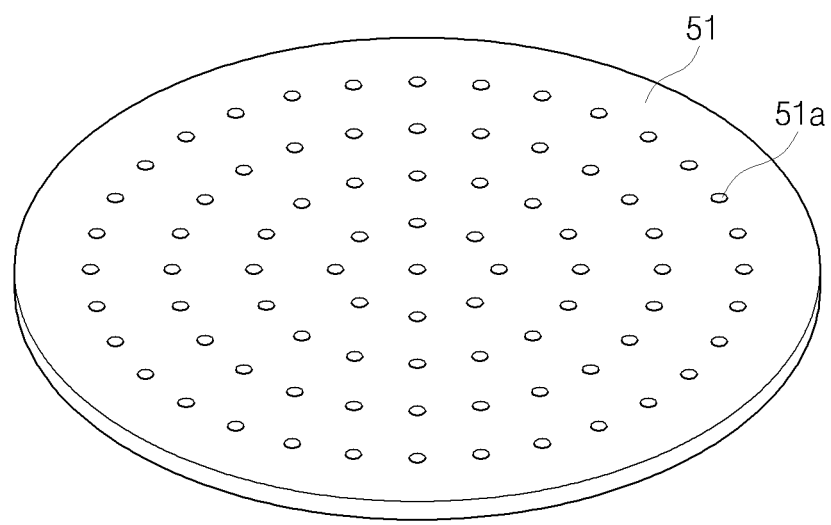
FIGS. 3 and 4 are views of a diffusion plate selectively inserted into a diffusion area of FIG. 1.
Figure 4:
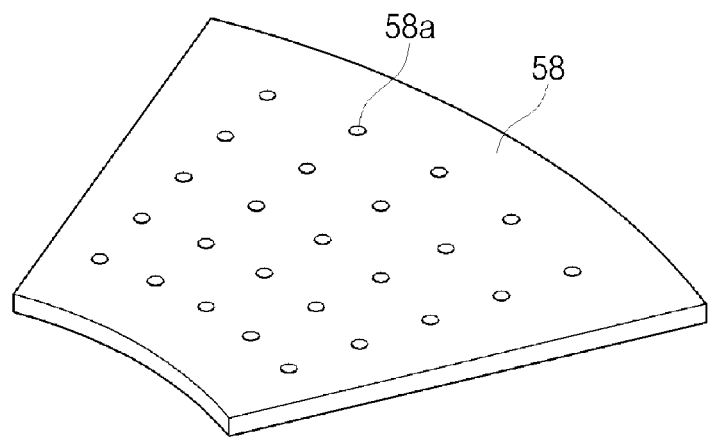
Figure 5:
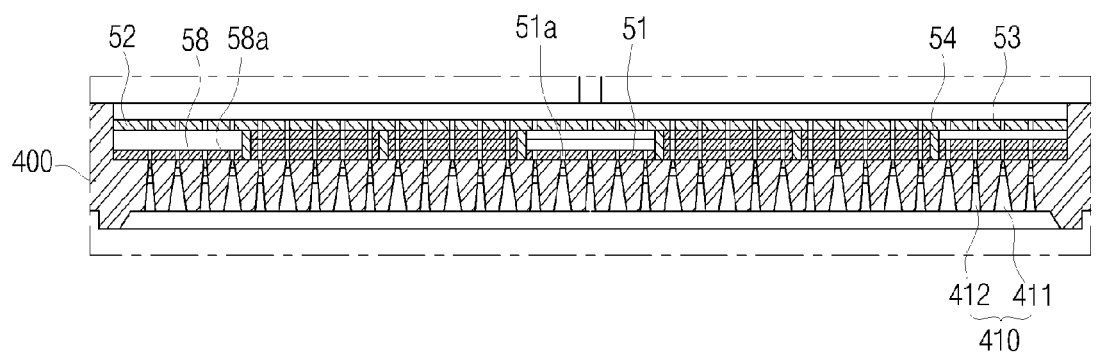
FIG. 5 is a view illustrating a state in which the diffusion plate is selectively inserted into the diffusion area of FIG. 1.

FIGS. 3 and 4 are views of diffusion plates selectively inserted into diffusion areas of FIG. 1; FIG. 5 is a view illustrating a state in which the diffusion plate is selectively inserted into the diffusion area of FIG. 1;

As described above, the buffer space 41 defined under the block plate 52 is partitioned into the plurality of diffusion areas 56 by the sidewall 54 (or the first to third circular sidewalls 541a, 542a, and 543a) and the first to third radial sidewalls 541b, 542b, and 543b. The diffusion areas 56 include the central area a and the first to third areas b, c, and d.

The first to third diffusion plates 51 and 58 shown in FIGS. 3 and 4 are inserted into the central area a and the first to third areas b, c, and d. The reaction gas moving to a lower side of the block plate 52 through the diffusion holes 53 are supplied onto the wafer 60 through the injection holes 410 via the first to second diffusion plates 51 and 58. The first diffusion plate 51 has a circular shape corresponding to that of the central area a. Also, the diffusion plate 51 has a plurality of connection holes 51a. The second diffusion plate 58 has a fan shape corresponding to those of the first to third areas b, c, and d. Also, the second diffusion plate 58 has a plurality of connection holes 58a.

Thus, the reaction gas moving to the lower side of the block plate 52 through the diffusion holes 53 moves onto the wafer 60 through the connection holes 51a and 58a and the injection holes 410. Here, the diffusion holes 53, the connection holes 51a and 58a, and the injection holes 410 may be matched with each other to allow the reaction gas to smoothly flow.

The plurality of diffusion plates 51 and 58 may be used for securing the process uniformity with respect to the wafer 60. The diffusion plates 51 and 58 may selectively interrupt the flow of the reaction gas diffused through the diffusion areas 56 in a state where the diffusion plates 51 and 58 are inserted into the diffusion areas 56. Thus, as shown in FIG. 5, the user may control the flow of the reaction gas using the diffusion plate 51 and 58 to correct process non-uniformity with respect to the wafer 60.

Referring to FIG. 5, one diffusion plate 51 is inserted into the central area a, and three diffusion plates 58 are stacked on the first and second areas b and c. Also, one diffusion plate 58 is inserted into the third area d disposed at a left side, and two diffusion plates 58 are stacked on the third area d disposed at a right side. As described above, the diffusion plates 51 and 58 are selectively inserted or removed according to the diffusion areas 56. Also, the number of diffusion plates 51 and 58 may be changed according to the diffusion areas.

Figure 6:
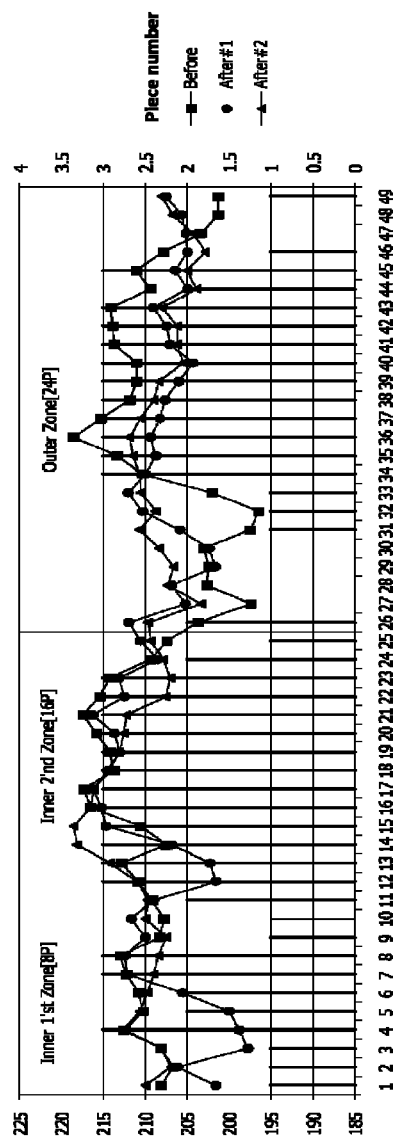

FIGS. 6 and 7 are graph and chart illustrating experimental results obtained using the diffusion plate of FIG. 1, respectively; and FIG. 6 is a graph illustrating a variation of a deposition rate with respect to the substrate areas according to the number of diffusion plates 51 and 58. FIG. 7 is a view illustrating data of deposition results with respect to the substrate areas after the flow of the reaction gas is corrected using the diffusion plates 51 and 58.

Referring to FIG. 6, an Inner 1'st Zone represents the central area a and the first area b, an Inner 2'nd Zone represents the second area c, and an Outer Zone represents the third area d. Also, a bar graph expressed as a "Piece number" represents the number of diffusion plates 51 and 58 inserted into the diffusion areas 56. As described above, zero to three diffusion plates 51 and 58 may be inserted or removed according to positions thereof. Also, the number of diffusion plates 51 and 58 may be changed according to the deposition results.

Referring to FIGS. 6 and 7, in the deposition results (that are expressed as 'Before' and 'Reference') before the correction using the diffusion plates 51 and 58, a minimum value Min is about 196.50 and a maximum value Max is about 218.50. Also, uniformity UNIF has a large width ranging from about 1.64 to about 5.31.

In the deposition results (that are expressed as 'After#1' and 'Primary Tune') primarily corrected using the diffusion plates 51 and 58, a minimum value Min is about 197.90 and a maximum value Max is about 216.20. Also, uniformity UNIF ranges from about 2.49 to about 3.53.

In the deposition results (that are expressed as 'After#2' and 'Secondary Tune') secondarily corrected using the diffusion plates 51 and 58, a minimum value Min is about 203.00 and a maximum value Max is about 218.70. Also, uniformity UNIF ranges from about 1.39 to about 2.73.

That is, as shown in FIGS. 6 and 7, when the diffusion plates 51 and 58 are selectively inserted/corrected according to process rates of the substrate areas, the deposition rate and the uniformity may be quickly improved.

Although all of the first to third circular sidewalls 541a, 542a, and 543a and the first to third radial sidewalls 541b, 542b, and 543b are installed and partitioned into the diffusion areas 56 in the current embodiment, the present invention is not limited thereto. For example, the first to third circular sidewalls 541a, 542a, and 543a and the first to third radial sidewalls 541b, 542b, and 543b may be selectively installed. When the first to third circular sidewalls 541a, 542a, and 543a and the first to third radial sidewalls 541b, 542b, and 543b are changed in position, each of the diffusion areas 56 and the diffusion plates 51 and 58 may be changed in shape according to positions thereof.

Also, although the diffusion areas 56 are disposed with respect to the center of the block plate 52 (or the shower head 400) in the current embodiment, the present invention is not limited thereto. For example, the diffusion areas 56 may be disposed in a row-and-column matrix shape.

Figure 8:
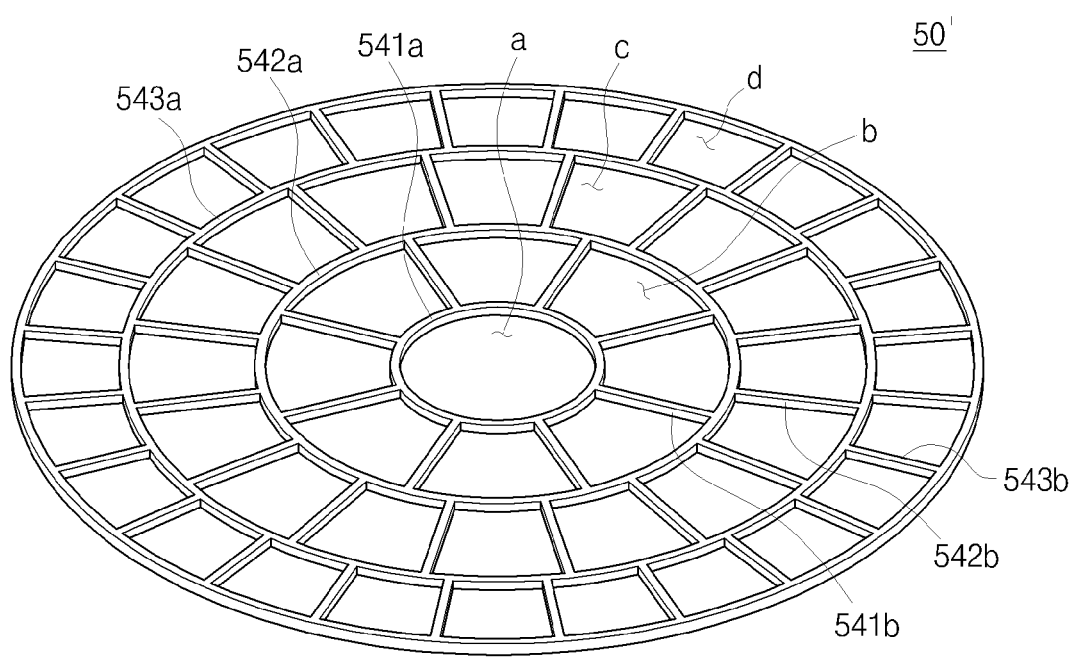
FIG. 8 is a view illustrating a modified example of FIG. 2.

FIG. 8 is a view illustrating a modified example of FIG. 2. Referring to FIG. 2, the diffusion unit 50 includes the block plate 52 installed within the buffer space 41. However, referring to FIG. 8, the block plate 52 may be removed. That is, the sidewall 54 may partition a lower portion of the buffer space 41 into a plurality of diffusion areas 56. The reaction gas supplied through the gas supply port 21 may move onto the diffusion areas 56 including the sidewall 54 through an upper portion of the buffer space 41 in which the sidewall 54 is not provided. Then, the reaction gas may move into the injection hole 410 through the diffusion plates 51 and 58 selectively inserted into the diffusion area 56.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

INDUSTRIAL APPLICABILITY

The substrate-processing apparatus according to the present invention may be applied to a semiconductor manufacturing apparatus or flat panel display manufacturing apparatus. In addition, the substrate-processing method according to the present invention may be applied to various processes for processing substrates using reaction gases.

What is claimed is:

1. A substrate-processing apparatus comprising:
   a lower chamber having an open space on an upper side;
   an upper chamber disposed on the upper side of the lower chamber;
   an inner space defined by the lower chamber and the upper chamber, in which a process for processing a substrate is performed;
   a shower head disposed in a lower portion of the upper chamber and having injection holes to supply a reaction gas toward the inner space;
   a buffer space defined by the upper chamber and the shower head therebetween;
   a gas supply port formed in the upper chamber to supply the reaction gas into the buffer space;
   a diffusion unit disposed in the buffer space to control a flow of the reaction gas supplied through the gas supply port, the diffusion unit including
      a block plate having a circular plate shape and spaced from a bottom surface of the upper chamber,
      sidewalls disposed on a bottom surface of the block plate and protruding from the bottom surface of the block plate, the sidewalls having a predetermined width and height and supporting the block plate on the shower head, a plurality of diffusion areas defined by the sidewalls and the block plate in a space between the block plate and the shower head, a plurality of diffusion holes formed in the block plate corresponding to all of the plurality of diffusion areas, and allowing all of the plurality of diffusion areas to communicate with the gas supply port; and a plurality of diffusion plates separated from the block plate and having connection holes, each of the diffusion plates having a same shape as a corresponding one to of the diffusion areas, at least one of the diffusion plates being selectively and detachably inserted into the diffusion areas.

2. The substrate-processing apparatus of claim 1, wherein the diffusion areas comprise:

a central area located in a central area of the block plate and having a circular shape;

a plurality of first areas surrounding the central area; and a plurality of second areas surrounding the first areas collectively.

3. The substrate-processing apparatus of claim 1, further comprising a support plate disposed under the shower head to place the substrate thereon, wherein the one or more diffusion plates are respectively inserted into the diffusion areas according to process rates of the corresponding substrate areas.

4. The substrate-processing apparatus of claim 1, wherein one or more diffusion plates are stacked in a diffusion area.

5. A substrate-processing apparatus comprising:

a chamber defining an inner space in which a process for processing a substrate is performed; and a shower head disposed in the inner space of the chamber and having injection holes to diffuse a reaction gas;

a buffer space defined by an upper portion of the chamber and the shower head in the inner space of the chamber;

a diffusion unit disposed in the buffer space to diffuse the reaction gas from a gas supply port, the diffusion unit including a plurality of circular sidewalls having a loop shape and arranged in concentric circles on a same level, a plurality of radial sidewalls having a straight line shape and arranged radially between neighboring circular sidewalls, the plurality of circular sidewalls and radial sidewalls having a predetermined width and height, a plurality of diffusion areas in which the reaction gas is diffused, the plurality of diffusion areas being defined by the plurality of circular sidewalls and radial sidewalls, and a plurality of diffusion plates having connection holes and separated from the circular sidewalls and radial sidewalls, each of the diffusion plates having a same shape as a corresponding one of the diffusion areas, at least one of the diffusion plates being selectively and detachably inserted into the diffusion areas.

6. The substrate-processing apparatus of claim 5, further comprising a support plate on which the substrate is placed thereon, wherein the one or more diffusion plates are respectively inserted into the diffusion areas according to process rates of the corresponding substrate areas.

7. The substrate-processing apparatus of claim 5, wherein one or more diffusion plates are stacked in a diffusion area.

8. The substrate-processing apparatus of claim 5, wherein the diffusion areas are disposed substantially parallel to the substrate.

9. The substrate-processing apparatus of claim 1, wherein the sidewalls include a plurality of circular sidewalls arranged in concentric circles on a same level, and a plurality of radial sidewalls having a straight line shape and arranged radially between neighboring circular sidewalls.

10. The substrate-processing apparatus of claim 2, wherein a number of diffusion plates inserted into the first diffusion area is different from a number of diffusion plates inserted into the second diffusion area.

11. The substrate-processing apparatus of claim 5, wherein the diffusion areas comprise:

a central area located in a central area of the diffusion areas;

a plurality of first areas surrounding the central area collectively; and a plurality of second areas surrounding the first areas collectively, and wherein a number of diffusion plates inserted into the first diffusion area is different from a number of diffusion plates inserted into the second diffusion area.

* * * * *